(12) United States Patent
Tyhach et al.

(10) Patent No.: US 7,378,868 B2
(45) Date of Patent: May 27, 2008

(54) MODULAR I/O BANK ARCHITECTURE

(75) Inventors: Jeffrey Tyhach, San Jose, CA (US); Chiakang Sung, Milpitas, CA (US); Khai Nguyen, San Jose, CA (US); Sanjay K. Charagulla, San Jose, CA (US); Ali Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/558,363

(22) Filed: Nov. 9, 2006

(65) Prior Publication Data

US 2007/0165478 A1 Jul. 19, 2007

Related U.S. Application Data

(63) Continuation-in-part of application No. 11/337,046, filed on Jan. 19, 2006.

(51) Int. Cl.
*H03K 19/173* (2006.01)
(52) U.S. Cl. .......................................... 326/38; 326/41
(58) Field of Classification Search ............. 326/37–41
See application file for complete search history.

(56) References Cited

U.S. PATENT DOCUMENTS

| | | | |
|---|---|---|---|
| 5,422,823 A * | 6/1995 | Agrawal et al. ............... 716/16 |
| 6,118,298 A * | 9/2000 | Bauer et al. ................... 326/39 |
| 6,289,496 B1 * | 9/2001 | Anderson et al. ............. 716/16 |
| 6,384,628 B1 | 5/2002 | Lacey et al. |
| 6,472,904 B2 * | 10/2002 | Andrews et al. ............... 326/38 |
| 6,480,026 B2 | 11/2002 | Andrews et al. |
| 6,608,500 B1 | 8/2003 | Lacey et al. |
| 6,838,902 B1 | 1/2005 | Elftmann et al. |
| 6,864,710 B1 * | 3/2005 | Lacey et al. ................... 326/39 |
| 6,946,872 B1 | 9/2005 | Pan et al. |
| 6,980,027 B2 | 12/2005 | Elftmann et al. |
| 7,020,728 B1 | 3/2006 | Jones et al. |
| 7,061,269 B1 * | 6/2006 | Agrawal et al. ............... 326/41 |
| 7,167,023 B1 * | 1/2007 | Pan et al. ...................... 326/41 |

* cited by examiner

*Primary Examiner*—Don Le
(74) *Attorney, Agent, or Firm*—Townsend and Townsend and Crew LLP (57) ABSTRACT

A programmable device I/O architecture allows for a variable number of I/O banks. Each I/O bank is of an I/O bank type. Each I/O bank type has a fixed number of I/O pins. I/O banks of the same I/O bank type are compatible within the same programmable device and between different types of programmable devices. The largest size I/O bank type and intermediate size I/O bank types are adapted to be a compatible supersets of every smaller I/O bank type. Support pins are regularly distributed between data pins in each I/O bank type. Multiple instances of the same or compatible I/O banks are arranged to be accessible from different sides of the programmable device. To facilitate circuit board layout, each I/O bank is arranged as a mirror and/or rotation of other I/O banks on the device.

40 Claims, 10 Drawing Sheets

MODULAR I/O BANK ARCHITECTURE

CROSS-REFERENCE TO RELATED APPLICATIONS

This application is a continuation-in-part to U.S. patent application Ser. No. 11/337,046, filed Jan. 19, 2006, and entitled "Modular I/O Bank Architecture," which is incorporated by reference herein for all purposes.

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Programmable devices include one or more input/output (I/O) banks for communication with external devices, such as memory devices, network interfaces, data buses and data bus controllers, microprocessors, other programmable devices, ASICs, or any other type of electronic device. Each I/O bank is connected with a number of conductive I/O pins, balls, or other electrical connectors in the programmable device chip package. An I/O bank includes logic for sending and receiving data signals, control signals, clock signals, power and ground signals, or any other type of signal used in conjunction with communications between the programmable device and an external device.

The I/O banks of a programmable device include logic, amplifiers, filters, and other circuits that together can be configured to provide one or more standard interfaces between the programmable device and external devices. Additionally, the I/O banks of a programmable device can be configured to provide custom or proprietary interfaces if required by a particular application.

Typically, a wide range of different programmable devices are designed as part of a programmable device family. The programmable devices within a device family typically have similar architectures but may differ in chip package size and type, the number of I/O pins, the number of logic cells, the number and type of functional blocks and other specialized logic blocks, and/or other characteristics.

In prior programmable device families, the programmable device architecture supports only a fixed number of I/O banks. As a result, programmable devices within the device family may have different amounts of I/O pins per I/O bank. For example, if a programmable device architecture supports 8 I/O banks, a small programmable device within the device family may only have 20 I/O pins per I/O bank, for a total of 160 I/O pins for the programmable device. In contrast, an example large programmable device within the device family may have 70 I/O pins per I/O bank, for a total of 560 I/O pins for the programmable device.

The use of a fixed number of I/O banks and a variable number of I/O pins per I/O bank in a programmable device architecture presents a number of problems. First, most I/O banks can only be configured to support a one interface at a time. As the number of I/O pins per I/O bank increases, any I/O pins not needed for the supported interface are left unused. The unused I/O pins from one or more I/O banks cannot be aggregated to support an additional interface. Thus, as the number of I/O pins per I/O bank increases, the percentage of I/O pins utilized typically decreases. This often forces designers to use programmable devices with even more I/O pins to ensure that there are sufficient I/O pins available to support the required interfaces, which further increases the costs of implementing a design. Additionally, these restrictions on I/O pin usage limit the designers' flexibility in circuit board layout.

Vertical migration is another problem arising from prior programmable device architectures that use of a fixed number of I/O banks and a variable number of I/O pins per bank. Often, designers will develop an initial design for a particular size programmable device within a device family. Subsequent revisions or improvements to the design may require additional programmable device resources. Designers would like to be able to implement the revised design using a larger size programmable device within the same device family without substantial reengineering and testing costs.

However, prior programmable device architectures having a fixed number of I/O banks and a variable number of I/O pins per bank often require substantial reengineering for vertical migration. For example, because the number of I/O pins per I/O bank often increases for a larger devices, the I/O banks of the larger device may not support the same I/O pin assignments as the corresponding I/O banks in the smaller device. Thus, designers must reengineer the device as well as associated circuit boards to account for these differences.

Noise, clock skew, and signal reflection are other problems arising in vertical migration that are caused by the use of a fixed number of I/O banks and a variable number of I/O pins per bank. As the number of pins per I/O bank increase, the total number of active switches and other components associated with I/O pins increases, thereby increasing the amount of noise and signal reflections introduced. Similarly, I/O banks with more I/O pins will have greater amounts of clock skew than smaller I/O banks. Thus, when a design is migrated from a smaller programmable device to a larger programmable device, designers must work to overcome the additional noise, signal reflections, and clock skew introduced by the use of I/O banks with additional I/O pins.

It is therefore desirable for a programmable device architecture to overcome the difficulties normally associated with a fixed number of I/O banks having variable numbers of I/O pins. It is desirable for the programmable device architecture to allow for efficient I/O pin utilization regardless of the total number of I/O pins. It is further desirable for the programmable device architecture to facilitate vertical migration to larger programmable devices while reducing the required reengineering effort. It is also desirable for the I/O banks to have improved performance as compared with I/O banks of prior programmable device architectures.

BRIEF SUMMARY OF THE INVENTION

In an embodiment, a programmable device I/O architecture allows for a variable number of I/O banks. Each I/O bank is of an I/O bank type. Each I/O bank type has a fixed number of I/O pins. I/O banks of the same I/O bank type are compatible within the same programmable device and between different types of programmable devices. The number of I/O pins for each I/O bank type is selected so that each of a set of interfaces can be implemented efficiently using I/O banks of at least one I/O bank type. In a further embodiment, the largest size I/O bank type and intermediate size I/O bank types are adapted to be a compatible supersets of every smaller I/O bank type. In another embodiment, the ratio between data pins and support pins in each I/O bank type is the same. In a further embodiment, support pins are regularly distributed between data pins in each I/O bank type. In a further embodiment, multiple instances of the same or compatible I/O bank types are arranged to be accessible from different sides of the programmable device. To facilitate circuit board layout, an embodiment of the programmable device architecture arranges the pins of each I/O bank as a mirror and/or rotation of pins of other I/O banks on the device.

In an embodiment, a programmable device in a programmable device family includes a programmable device core and a first and second I/O banks. The first I/O bank comprises a first set of pins that is accessible from a first side of the programmable device. The second I/O bank comprises a second set of pins that is accessible from a second side of the programmable device. In an embodiment, at least a first portion of the first set of pins of the first I/O bank has a one-to-one correspondence with the second set of pins of the second I/O bank. In a further embodiment, the second set of pins is arranged as a rotation of the first set of pins. In embodiments, the rotation may be a 90 degree rotation or a 180 degree rotation.

In still another embodiment, a third I/O bank comprises a third set of pins. At least the first portion of the pins of the first I/O bank has a one-to-one correspondence with the third set of pins of the third I/O bank. The third set of pins is accessible from the second side of the programmable device. The third set of pins is arranged as a symmetrical reflection of the second set of pins.

In another embodiment, the first set of pins includes a remaining portion of the first set of pins that does not have any correspondence with the second set of pins of the second I/O bank. The first set of pins includes data pins and support pins, which include power and ground pins. A ratio between the number of power and ground pins and the number of data pins is fixed for the first and second I/O banks. In an embodiment, this ratio may be the same for the first and second I/O banks. The power and ground pins are interleaved with the data pins.

BRIEF DESCRIPTION OF THE DRAWINGS

The invention will be described with reference to the drawings, in which.

DETAILED DESCRIPTION OF THE INVENTION

Figure 1:
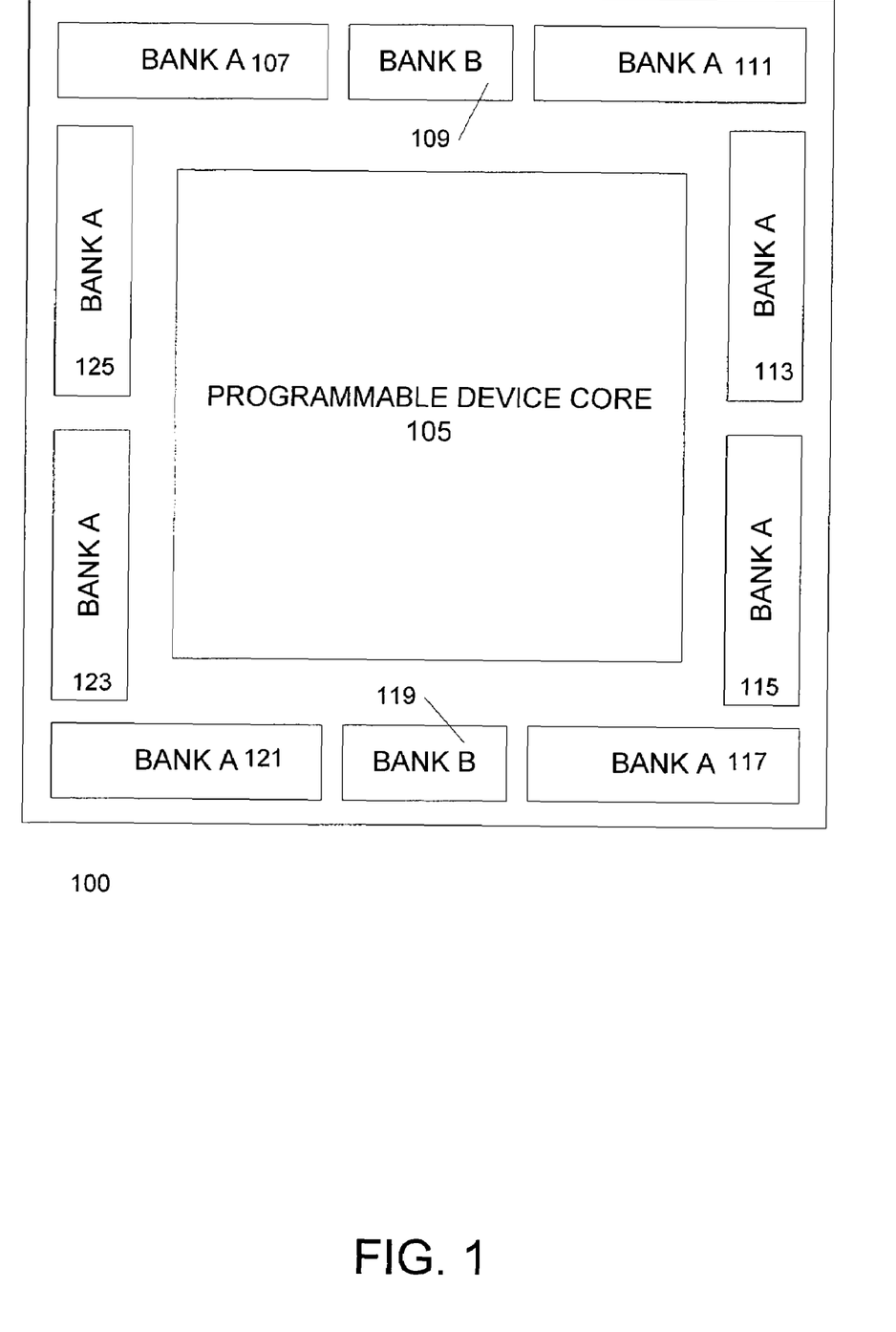
FIG. 1 illustrates a programmable device and I/O bank architecture according to an embodiment of the invention.

FIG. 1 illustrates a programmable device and I/O bank architecture 100 according to an embodiment of the invention. Device architecture 100 includes a programmable device core 105. Programmable device core 105 includes programmable device components such as logic cells, functional blocks, memory units, and a configurable switching circuit.

Device architecture 100 includes a plurality of I/O banks, such as I/O banks 107, 109, 111, 113, 115, 117, 119, 121, 123, and 125. In an embodiment, device architecture 100 allows for any number of I/O banks.

In an embodiment, the plurality of I/O banks belong to a limited number of I/O bank types. For example, I/O banks 107, 111, 113, 115, 117, 121, 123, and 125 are of I/O bank type A. I/O banks 109 and 119 belong to I/O bank type B. Each I/O bank type specifies the number of I/O pins and other attributes for its member I/O banks. For example, type A I/O banks may have 60 I/O pins and type B I/O banks may have 36 I/O pins. The number of I/O banks types is not limited to two types, and many common implementations of device architecture 100 may include four or more different I/O types.

The number of I/O pins for each I/O bank type can be specified based on the common interface types to be implemented by the I/O banks. If necessary, two or more I/O banks can be aggregated to implement a single interface. Table 1 lists the number of I/O banks required to implement several common standard interfaces based on the number of I/O pins available in the bank. These interfaces are provided for the purposes of illustration, and other interfaces may be implemented with one or more I/O banks, including memory interfaces, bus interfaces, and general purpose digital communications interfaces. Table 1 and similar tables can be used to help select an optimal number of I/O pins for each I/O bank type based on the anticipated interface applications for device architecture 100.

TABLE 1

I/O Banks Required to Implement Interfaces

| Interface | | | | | | | |
|---|---|---|---|---|---|---|---|
| | | QDR | QDR | | RLII | RLII | |
| DDR 36 | DDR 72 | 36 | 72 | SPI4.2 | 36 | 72 | PCI 64 |
| Bank Size | | | | | | | |
| 72 | 118 | 64 | 100 | 86 | 73 | 113 | 91 |
| 22 | 4 | 6 | 3 | 5 | 4 | 4 | 6 | 5 |
| 23 | 4 | 6 | 3 | 5 | 4 | 4 | 5 | 4 |
| 24 | 3 | 5 | 3 | 5 | 4 | 4 | 5 | 4 |
| 25 | 3 | 5 | 3 | 4 | 4 | 3 | 5 | 4 |
| 26 | 3 | 5 | 3 | 4 | 4 | 3 | 5 | 4 |
| 27 | 3 | 5 | 3 | 4 | 4 | 3 | 5 | 4 |
| 28 | 3 | 5 | 3 | 4 | 4 | 3 | 5 | 4 |
| 29 | 3 | 5 | 3 | 4 | 3 | 3 | 4 | 4 |
| 30 | 3 | 4 | 3 | 4 | 3 | 3 | 4 | 4 |
| 31 | 3 | 4 | 3 | 4 | 3 | 3 | 4 | 3 |
| 32 | 3 | 4 | 2 | 4 | 3 | 3 | 4 | 3 |
| 33 | 3 | 4 | 2 | 4 | 3 | 3 | 4 | 3 |
| 34 | 3 | 4 | 2 | 3 | 3 | 3 | 4 | 3 |
| 35 | 3 | 4 | 2 | 3 | 3 | 3 | 4 | 3 |
| 36 | 2 | 4 | 2 | 3 | 3 | 3 | 4 | 3 |
| 37 | 2 | 4 | 2 | 3 | 3 | 2 | 4 | 3 |
| 38 | 2 | 4 | 2 | 3 | 3 | 2 | 3 | 3 |
| 39 | 2 | 4 | 2 | 3 | 3 | 2 | 3 | 3 |
| 40 | 2 | 3 | 2 | 3 | 3 | 2 | 3 | 3 |
| 41 | 2 | 3 | 2 | 3 | 3 | 2 | 3 | 3 |

TABLE 1-continued

I/O Banks Required to Implement Interfaces

| | | | | Interface | | | | |
|---|---|---|---|---|---|---|---|---|
| | DDR 36 | DDR 72 | QDR 36 | QDR 72 | SPI4.2 | RLII 36 | RLII 72 | PCI 64 |
| | | | | Bank Size | | | | |
| | 72 | 118 | 64 | 100 | 86 | 73 | 113 | 91 |
| 42 | 2 | 3 | 2 | 3 | 3 | 2 | 3 | 3 |
| 43 | 2 | 3 | 2 | 3 | 2 | 2 | 3 | 3 |
| 44 | 2 | 3 | 2 | 3 | 2 | 2 | 3 | 3 |
| 45 | 2 | 3 | 2 | 3 | 2 | 2 | 3 | 3 |
| 46 | 2 | 3 | 2 | 3 | 2 | 2 | 3 | 2 |
| 47 | 2 | 3 | 2 | 3 | 2 | 2 | 3 | 2 |
| 48 | 2 | 3 | 2 | 3 | 2 | 2 | 3 | 2 |
| 49 | 2 | 3 | 2 | 3 | 2 | 2 | 3 | 2 |
| 50 | 2 | 3 | 2 | 2 | 2 | 2 | 3 | 2 |
| 51 | 2 | 3 | 2 | 2 | 2 | 2 | 3 | 2 |
| 52 | 2 | 3 | 2 | 2 | 2 | 2 | 3 | 2 |
| 53 | 2 | 3 | 2 | 2 | 2 | 2 | 3 | 2 |
| 54 | 2 | 3 | 2 | 2 | 2 | 2 | 3 | 2 |
| 55 | 2 | 3 | 2 | 2 | 2 | 2 | 3 | 2 |
| 56 | 2 | 3 | 2 | 2 | 2 | 2 | 3 | 2 |
| 57 | 2 | 3 | 2 | 2 | 2 | 2 | 2 | 2 |
| 58 | 2 | 3 | 2 | 2 | 2 | 2 | 2 | 2 |
| 59 | 2 | 2 | 2 | 2 | 2 | 2 | 2 | 2 |
| 60 | 2 | 2 | 2 | 2 | 2 | 2 | 2 | 2 |
| 61 | 2 | 2 | 2 | 2 | 2 | 2 | 2 | 2 |
| 62 | 2 | 2 | 2 | 2 | 2 | 2 | 2 | 2 |

Additionally, an I/O pin efficiency can be determined based on the number of I/O pins in each I/O bank type. The I/O pin efficiency is number of I/O pins utilized in one or more I/O banks to implement an interface compared with the total number of I/O pins available in these I/O banks. The number of I/O bank types and the number of I/O pins in each I/O bank type can be selected to maximize I/O bank pin efficiency for the anticipated interface applications of device architecture 100. Table 2 illustrates an example I/O pin efficiency determination for two I/O bank types having 36 and 54 I/O pins, respectively.

TABLE 2

Example I/O Pin Efficiency for Two Different I/O Bank Types

| | | 36-Bit Bank | | | | 54-Bit Bank | | |
|---|---|---|---|---|---|---|---|---|
| Interface | Req I/Os | #36b Banks | I/Os Used | Left Over | Efficiency (%) | #54b Banks | I/Os Used | Left Over | Efficiency (%) |
| DDR-2 36-bit (×8) | 72 | 2 | 72 | 0 | 100% | 2 | 108 | 36 | 67% |
| DDR-2 72-bit (×8) | 122 | 4 | 144 | 22 | 85% | 3 | 162 | 40 | 75% |
| DDR-2 72-bit (×4) | 140 | 5 | 180 | 40 | 78% | 3 | 162 | 22 | 86% |
| ODR2 36-bit | 68 | 2 | 72 | 4 | 94% | 2 | 108 | 40 | 63% |
| ODR2 72-bit | 108 | 4 | 144 | 36 | 75% | 2 | 108 | 0 | 100% |
| SPI4.2 LVDS + LVTTL | 78 | 3 | 108 | 30 | 72% | 2 | 108 | 30 | 72% |
| SPI4.2 LVDS | 56 | 3 | 106 | 22 | 80% | 2 | 108 | 22 | 80% |
| PCI-32 | 51 | 2 | 72 | 21 | 71% | 1 | 54 | 3 | 94% |
| PCI-64 | 91 | 3 | 108 | 17 | 84% | 2 | 108 | 17 | 84% |

In the example of table 2, each example interface type can be implemented with a relatively high I/O pin efficiency in at least one of I/O bank types. For example, a PCI-32 interface implemented with two 36 I/O pin I/O banks has an I/O pin efficiency of 71%, while the PCI-32 interface implemented with one 54 I/O pin I/O bank has an I/O pin efficiency of 94%.

In an embodiment, I/O banks of the same I/O bank type have similar attributes and capabilities, regardless of their locations within a particular device. For example, I/O banks 109 and 119, which are both of type B, can have similar numbers of I/O pins, power and grounding characteristics, signal to noise ratios, reflection characteristics, timing characteristics, and clock skews. Because of the similarities of I/O banks having the same type, designers can utilize different I/O banks of the same type interchangeably, which provides increased flexibility in circuit board layout.

This modular I/O bank architecture can be expanded to include more than two I/O bank types. For example, a family of programmable devices include an arbitrary number of I/O bank types, such as three, four, five, or more different types of I/O banks. Each device within this device family may have any arbitrary number of I/O banks of one or more of the I/O bank types. For example, a first device in a programmable device family may include 16 I/O banks of type A, a second device in the programmable device family may include 16 I/O banks of type B, and a third device in the programmable device family may include 16 I/O banks of type B and 8 I/O banks of type C.

Figure 2:
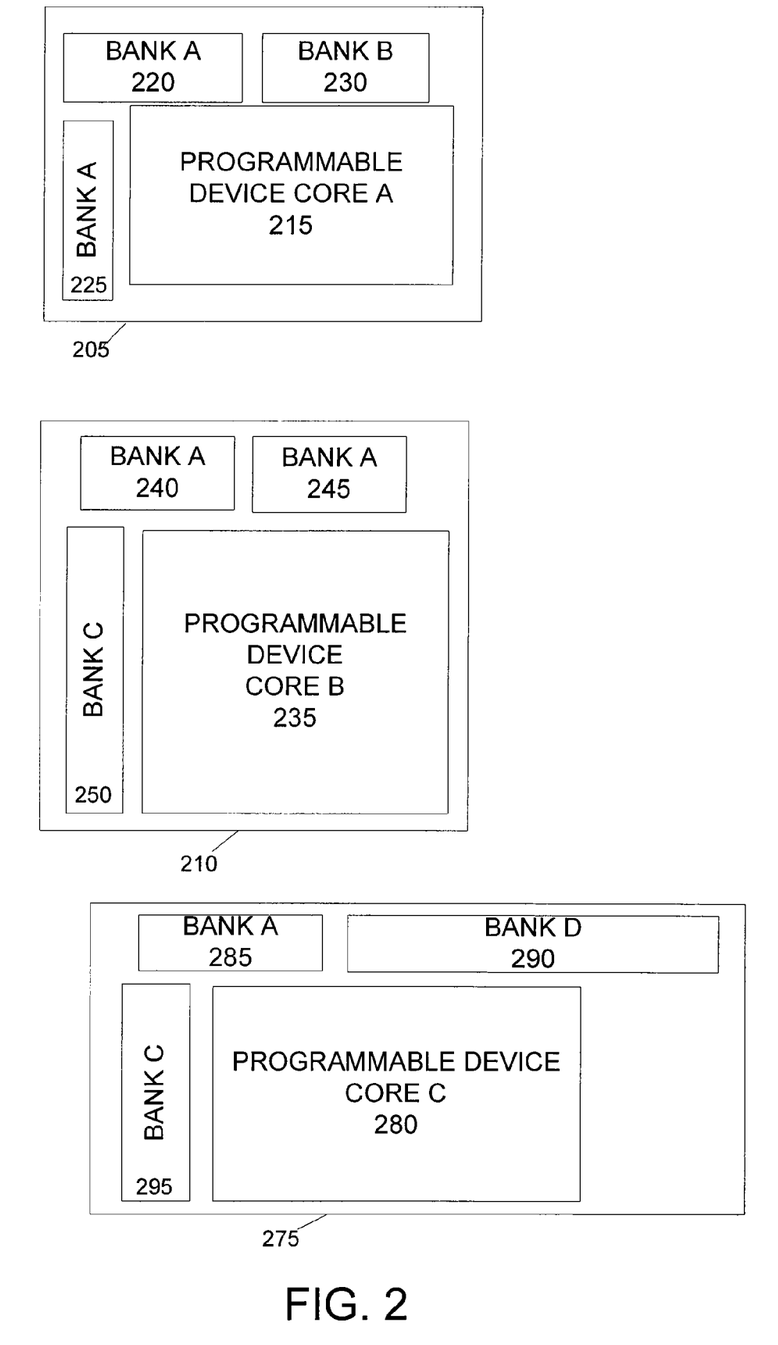
FIG. 2 illustrates a family of programmable devices according to an embodiment of the invention.

In further embodiments, I/O banks of the same type have similar attributes for different devices within the same device family, which facilitates vertical migration. FIG. 2 illustrates a family 200 of programmable devices according to an embodiment of the invention. Device family 200 includes programmable devices 205, 210, and 275. Programmable device 205 includes programmable device core 215, which includes programmable device components such as logic cells, functional blocks, memory units, and a configurable switching circuit. Programmable device 205 includes two I/O banks 220 and 225 of a first I/O bank type, referred to as type A, and one I/O bank 230 of a second I/O bank type, referred to as type B.

Similarly, programmable device 210 includes a programmable device core 235, two I/O banks 240 and 255 of type A, and one I/O bank 250 of a third I/O bank type, referred to as type C. Programmable device 275 includes a programmable device core 280, an I/O bank 285 of type A, an I/O bank 295 of type C, and an I/O bank 290 of type D.

In an embodiment of the device family 200, I/O banks of the same type have similar I/O pin counts, power and grounding characteristics, signal to noise ratios, reflection and impedance characteristics, timing characteristics, and clock skews. For example, I/O banks 220, 240, and 285 in programmable devices 205, 210, and 275, respectively, have similar characteristics. Thus, a design using I/O bank 220 and initially targeted for programmable device 205 can be migrated to programmable device 210 and corresponding I/O bank 240 or to programmable device 275 and corresponding I/O bank 285 with minimal reengineering effort.

In a further embodiment, I/O banks of different types can be compatible. For example, an I/O bank of type C can be a superset of an I/O bank of type A. In this embodiment, I/O bank 250 can have more I/O pins than I/O bank 225. However, a portion of the I/O pins of I/O bank 250 will be compatible with the I/O pins of I/O bank 225. In still a further embodiment, the other characteristics of two or more I/O bank types, such as power, voltage, grounding, impedance, signal to noise ratios, timing characteristics, clock skew and any other attributes aside from the number of I/O pins, are similar. Thus, a design using I/O bank 225 and initially targeted for programmable device 205 can be migrated to programmable device 210 and larger but compatible I/O bank 250. Similarly, I/O banks of type A can be a compatible superset of I/O banks of type B, such as bank 230, so that designs using I/O bank 230 of programmable device 205 can be migrated to larger but compatible I/O bank 245 of programmable device 210.

Figure 3:
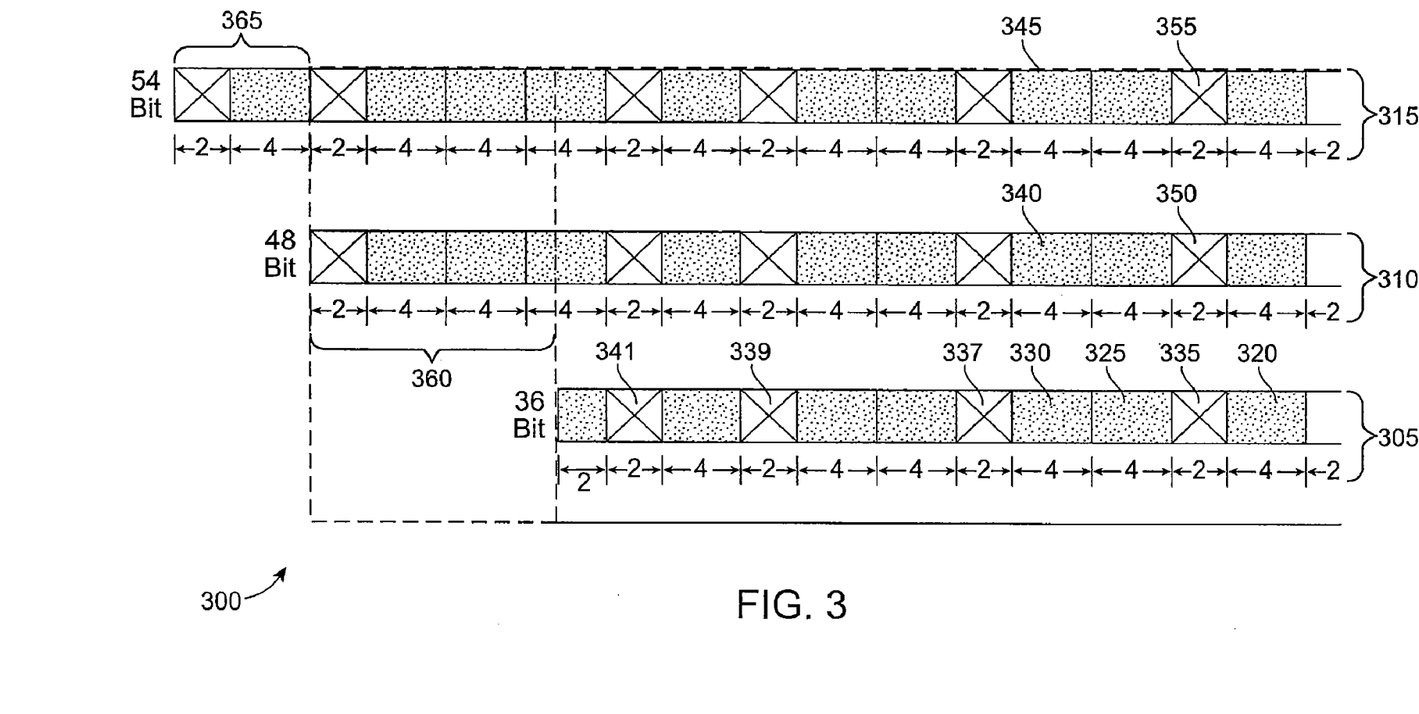
FIG. 3 illustrates I/O pin compatibility between I/O banks according to an embodiment of the invention.

FIG. 3 illustrates I/O pin compatibility between I/O banks according to an embodiment of the invention. The functions of I/O pins for I/O bank types 305, 310, 315. I/O bank type 305 includes 36 I/O pins for carrying data signals and power and ground connections. I/O bank 305 can include additional pins not shown in FIG. 3 for clock signals or other connections.

In an embodiment, I/O pins are arranged in groups of two or four pins. For example, I/O bank type 305 include groups of four data pins, such as groups 320, 325, and 330. I/O bank type also includes groups of two power and ground pins, such as groups 335, 337, 339, and 341. In an embodiment, the groups of power and ground pins are distributed regularly throughout the I/O bank. For example, every group of power and ground pins, such as group 335, is adjacent to at most eight data pins, such as data pin groups 320 and 325. This distribution of power and ground pin between data pins reduces the overall signal to noise ratios and helps maintain constant signal to noise ratios regardless of the total number of I/O pins in the I/O bank type, which facilitates vertical migration to larger I/O banks.

In an embodiment, each group of I/O pins in I/O bank type 305 has a corresponding group in I/O bank type 310, which has 48 I/O pins, and I/O bank type 315, which has 54 I/O pins. For example, I/O data pin group 330 corresponds with data pin group 340 in I/O bank type 310 and with data pin group 345 in I/O bank type 315. Similarly, power and ground pin group 335 in I/O bank type 305 corresponds with group 350 in I/O bank type 310 and group 355 in I/O bank type 315.

As discussed above, larger I/O bank types can be supersets of smaller I/O bank types to maintain compatibility. In an embodiment, I/O bank type 310 includes all of the I/O pins of I/O bank type 305 in corresponding locations. Thus, I/O bank type 310 is pin-compatible with I/O bank type 305. A programmable device design implemented using I/O bank type 305 can be migrated to a different device using I/O bank type 310 with little or no reengineering. The additional I/O pins in I/O bank type 310, such as additional I/O pins 360, are appended at the end of the I/O bank, so as to not break compatibility with I/O bank type 305. Similarly, additional I/O pins 360 are appended to the end of I/O bank type 315, which makes this I/O bank type compatible with I/O bank types 310 and 305.

In addition to maintaining pin compatibility as I/O bank types increase in size, an embodiment of the invention arranges modular I/O banks on a programmable device to increase flexibility in circuit board layout. In this embodiment, modular I/O banks of the same type (or of different but pin compatible types) are arranged in both rotated and mirrored form on two or more sides of the programmable device. This arrangement provides flexibility in circuit board layout when connecting the programmable device with one or more external devices.

Figure 5A:
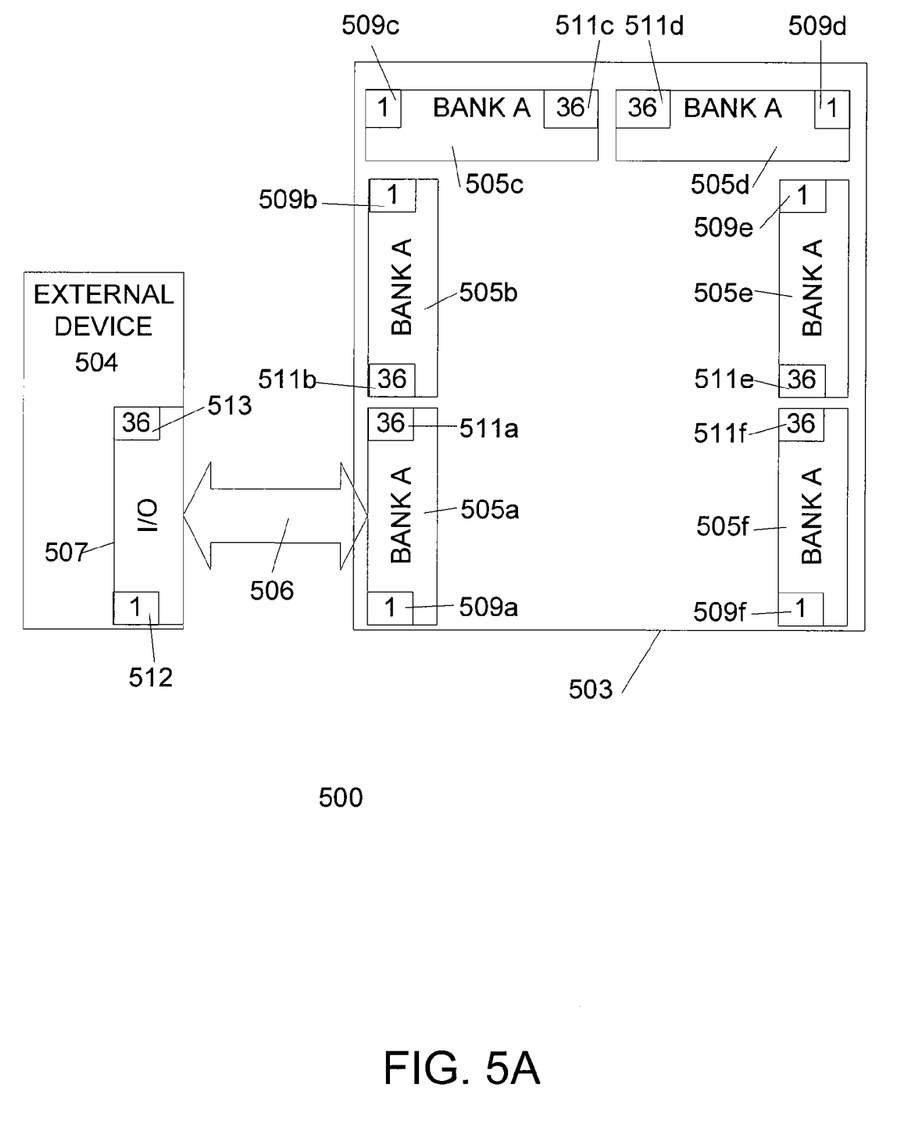
FIGS. 5A-5F illustrates an example modular I/O bank arrangements according to an embodiment of the invention.

FIGS. 5A-5F illustrates an example modular I/O bank arrangements according to an embodiment of the invention. FIG. 5A illustrates an example circuit board layout 500 including a programmable device 503 and an external device 504, such as a memory device, a processor, an application-specific integrated circuit, a communications device, a different programmable device, or any other type of digital or analog device capable of interfacing with a programmable device.

Programmable device 503 includes a modular I/O banks 505a, 505b, 505c, 505d, 505e, and 505f. In this example, the modular I/O banks 505 are of the same bank type, as described above. However, alternate embodiments may utilize pin compatible modular I/O banks of one or more different types for a portion of the modular I/O banks 505, such that one portion of the modular I/O banks 505 includes pin compatible supersets of another portion of modular I/O banks 505.

Programmable device 503 is connected with external device 504 via a bus 506 between I/O port 507 of the external device 505 and I/O bank 505a of the programmable device 505a. In this example, pin 1 509a of I/O bank 505a is connected via bus 506 to pin 1 512 of the I/O port 507 of external device 504. Similarly, pin 36 511a of I/O bank 505a is connected via bus 506 to pin 36 513 of the I/O port 507 of external device 504. The other pins of the I/O bank 505a and I/O port 507 are connected via bus 506 in a similar manner and are omitted for clarity.

On typical circuit boards, bus 506 includes a number of circuit board traces. The layout of bus 506, which includes the routing, length, width, and spacing of its circuit board traces and the proximity of its circuit board traces to other portions of the circuit board, must be carefully considered to ensure that the signals carried by bus 506 satisfy the timing, noise, voltage, and other requirements of the programmable device 503 and external device 505. Although the bus 506 is shown in FIGS. 5A-5F as a straight line connection for clarity, typically bus layouts may include complicated paths with many corners or bends over one or more layers of a circuit board. Because of these layout considerations, changes to the overall circuit board layout including prior types of programmable devices often require substantial reengineering.

An embodiment of the invention arranges its modular I/O banks in rotated and mirrored form to provide flexibility in circuit board layout and enable changes to circuit board layout without substantial reengineering. I/O bank 505a includes pin 1 509a positioned at the bottom of the device 503 and pin 36 511a positioned at the top of the I/O bank 505a. I/O bank 505c is arranged on the programmable device 503 to be a 90 degree clockwise rotation of I/O bank 505a. In I/O bank 505c, pin 1 509c is located on the left side of the I/O bank and pin 36 511c is located on the right side of the I/O bank. Similarly, I/O bank 505e is arranged on the programmable device 503 to be a 180 degree rotation of I/O bank 505a, so that pin 1 509e is located on the top side of the I/O bank 505e and pin 36 511e is located on the bottom side of the I/O bank 505e.

In addition to bank 505a having corresponding rotated I/O banks 505c and 505e on device 503, device 503 also includes mirrored versions of I/O bank 505a. The mirrored versions of I/O bank 505a are symmetrical reflections of I/O bank 505a. For example, I/O bank 505b is a mirrored version of I/O bank 505a. I/O bank 505b includes pin 1 509b located at the top of I/O bank 505b and pin 36 511b located at the bottom of I/O bank 505b. This is the opposite of I/O bank 505a, which has pin 1 509a located at the bottom of I/O bank 505a and pin 36 511a located at the top of I/O bank 505a. Device 503 also includes mirrored I/O banks 505d and 505f, which are rotated versions of I/O bank 505b.

The rotated and mirrored versions of the I/O banks 505 provide flexibility in circuit board layout. Once an initial layout of the programmable device 503, external device 504, and connecting bus 506 has been determined, the external device 504 and connecting bus 506 may be moved to any of the other modular I/O banks 505 with minimal reengineering effort.

Figure 5B:
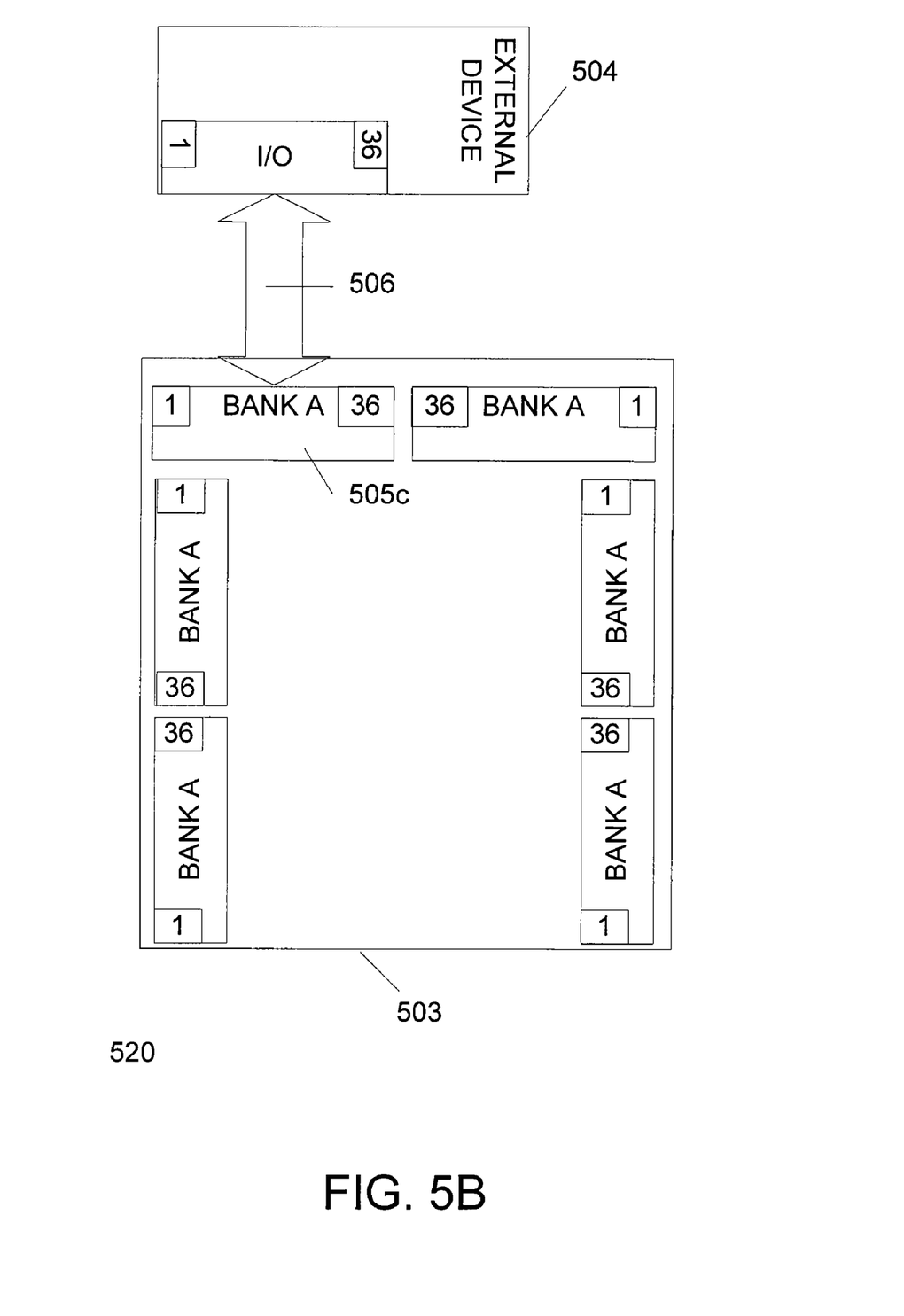

FIG. 5B illustrates a second circuit board layout 520 including programmable device 503 and external device 504. In circuit board layout 520, external device 504 is connected via bus 506 with I/O bank 505c of programmable device 503. Because I/O bank 505c is identical to I/O bank 505a rotated 90 degrees, the layout of the bus 506 in circuit board layout 500 can be rotated 90 degrees and used in circuit board layout 520. Provided the position of external device 504 relative to I/O bank 505a in circuit board layout 500 is the same as the position of external device 504 relative to I/O bank 505c in circuit board layout 520, there will be minimal reengineering required to change board layout 500 into board layout 520.

Figure 5C:
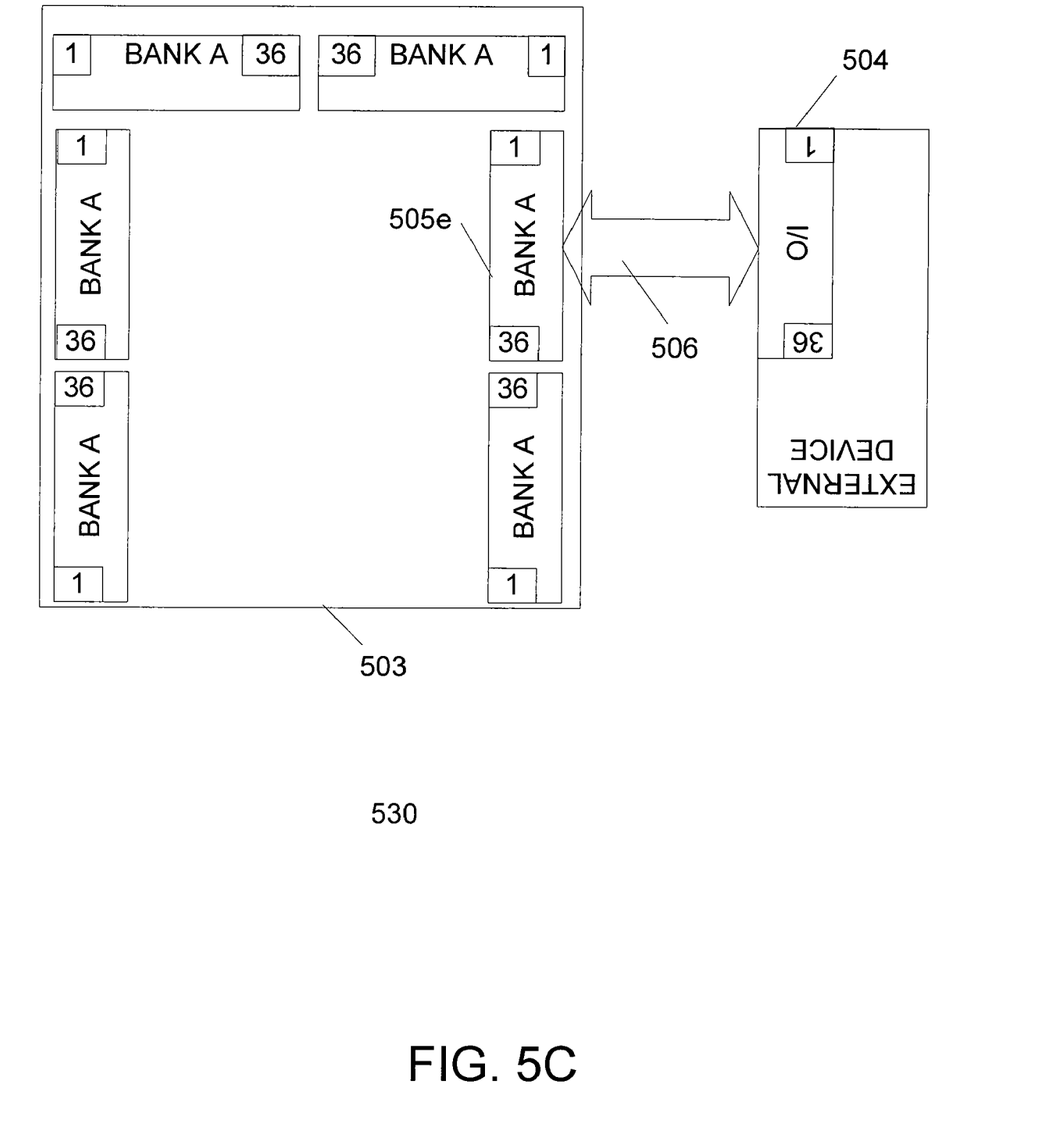

Similarly, FIG. 5C illustrates a third circuit board layout 530 including programmable device 503 and external device 504. In circuit board layout 530, external device 504 is connected via bus 506 with I/O bank 505e of programmable device 503. Because I/O bank 505e is identical to I/O bank 505a rotated 180 degrees, the layout of the bus 506 in circuit board layout 500 can be rotated 180 degrees and used in circuit board layout 530.

Figure 5D:
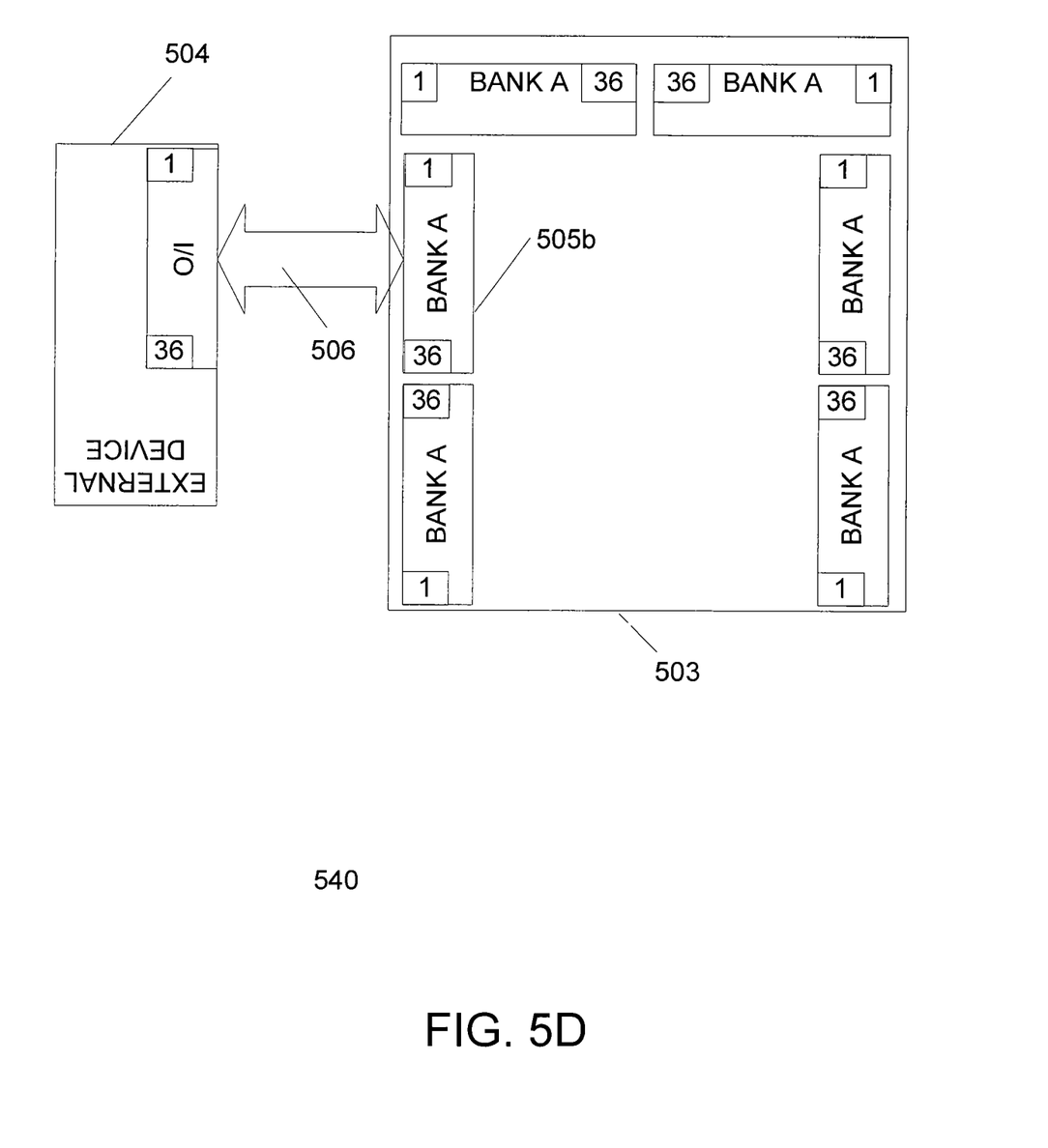

FIG. 5D illustrates a fourth circuit board layout 540 including programmable device 503 and external device 504. In circuit board layout 540, external device 504 is connected via bus 506 with I/O bank 505b of programmable device 503. Because I/O bank 505c is a mirror of I/O bank 505a, the layout of the bus 506 in circuit board layout 500 can mirrored or turned upside down and used in circuit board layout 540.

Figure 5E:
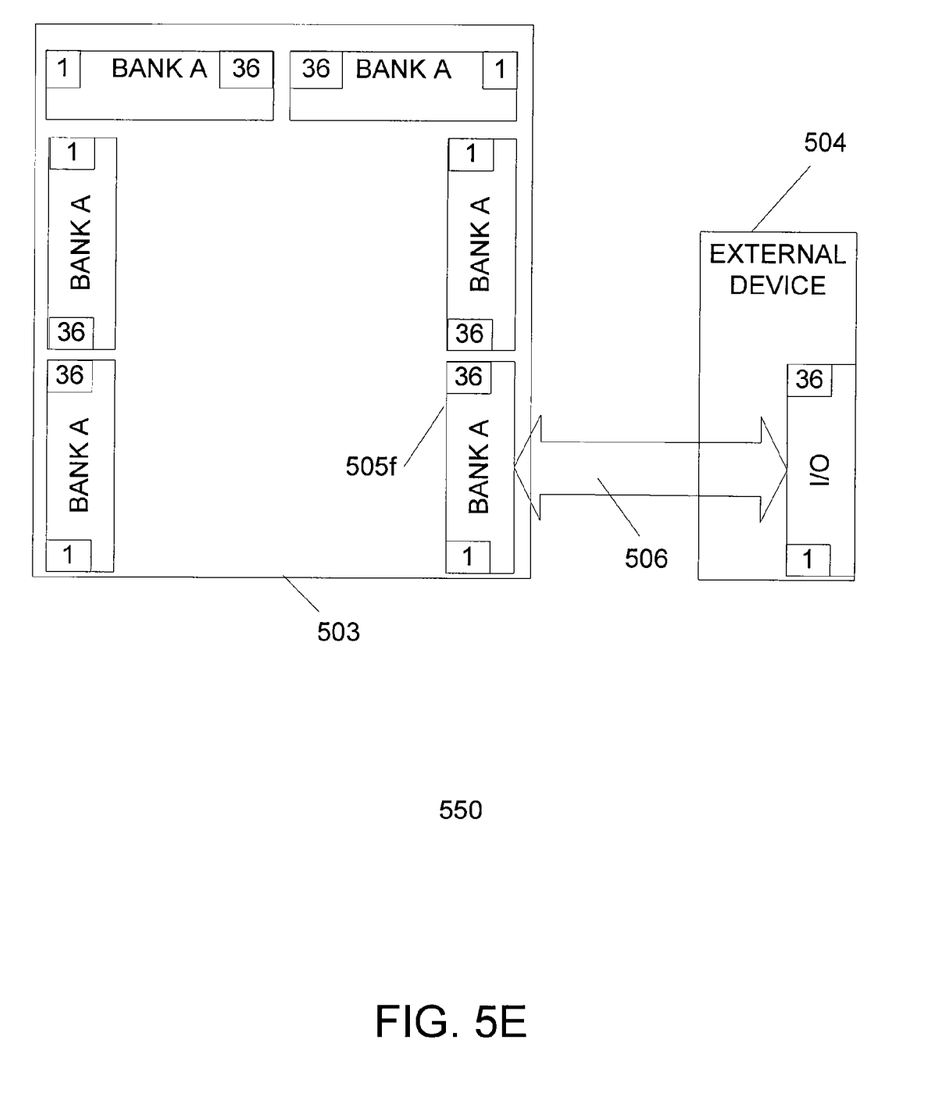

FIG. 5E illustrates a fifth circuit board layout 550 including programmable device 503 and external device 504. In circuit board layout 550, external device 504 is connected via bus 506 with I/O bank 505f of programmable device 503. Because I/O bank 505f is a version of I/O bank 505b, rotated 180 degrees, the layout of the bus 506 in circuit board layout 500 can mirrored about the center of device 503 and used in circuit board layout 550.

Figure 5F:
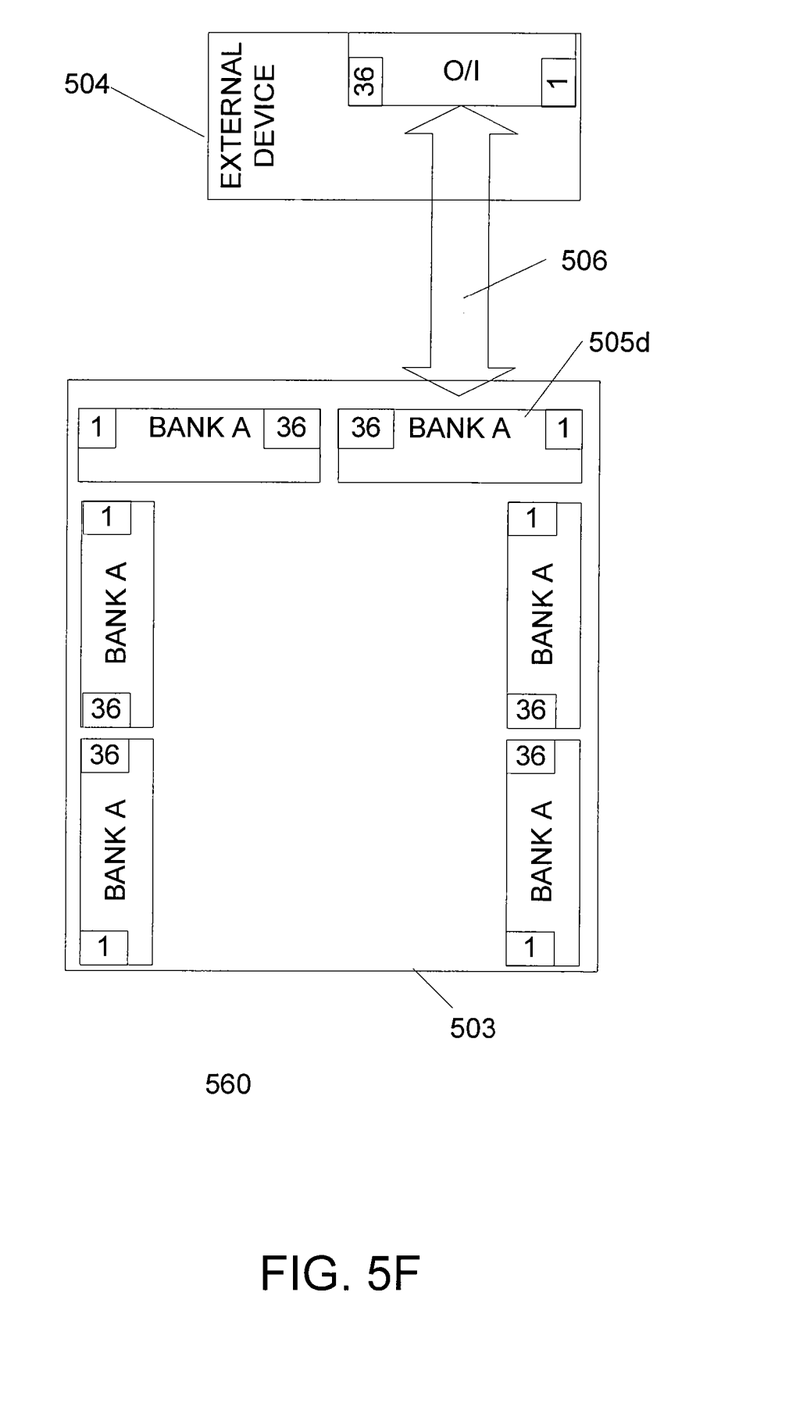

FIG. 5F illustrates a sixth circuit board layout 560 including programmable device 503 and external device 504. In circuit board layout 560, external device 504 is connected via bus 506 with I/O bank 505d of programmable device 503. Because I/O bank 505d is a version of I/O bank 505b, rotated 90 degrees, the layout of the bus 506 in circuit board layout 500 can be rotated 90 degrees and mirrored about the center of device 503 and used in circuit board layout 560.

Figure 4:
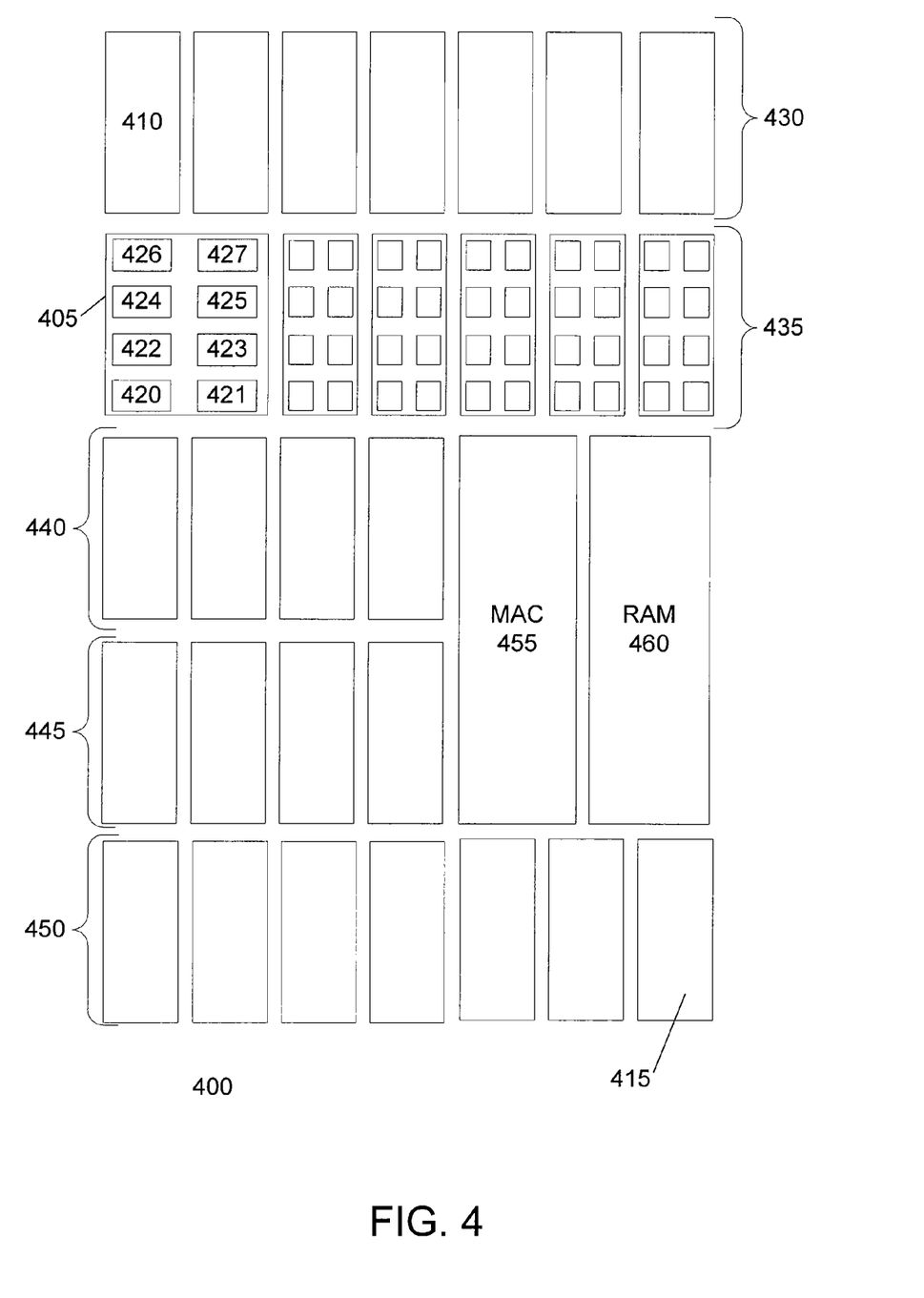
FIG. 4 illustrates a programmable device suitable for use with an embodiment of the invention.

FIG. 4 illustrates a programmable device 400 suitable for use with an embodiment of the invention. Programmable device 400 includes a number of logic array blocks (LABs), such as LABs 405, 410, 415. Each LAB includes a number of programmable logic cells using logic gates and/or look-up tables to perform logic operations, as well as registers to store and retrieve data. LAB 405 illustrates in detail logic cells 420, 421, 422, 423, 424, 425, 426, and 427. Logic cells are omitted from other LABs in FIG. 4 for clarity. The LABs of device 400 are arranged into rows 430, 435, 440, 445, and 450. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 400 also include specialized functional blocks, such as multiply and accumulate block (MAC) 455 and random access memory block (RAM) 460. The configuration of the programmable device is specified at least in part by configuration data stored in configuration memory 475. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. Although the configuration memory 475 is shown in FIG. 4 as a monolithic unit, in some programmable devices, configuration memory 475 is scattered all over the programmable device. In these types of programmable devices, portions of the configuration memory can lie within the logic cells, functional blocks, and configurable switching circuit of the programmable device.

For clarity, the portion of the programmable device 400 shown in FIG. 4 only includes a small number of logic cells, LABs, and functional blocks. Typical programmable devices will include thousands or tens of thousands of these elements.

Further embodiments can be envisioned to one of ordinary skill in the art after reading the attached documents. For example, although the invention has been discussed with reference to programmable devices, it is equally applicable to standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A programmable device in a programmable device family comprising a plurality of programmable devices, the programmable device comprising:

a programmable device core;
- a first I/O bank consisting of a first set of consecutive pins including data and support pins, wherein the first set of consecutive pins is accessible from a first side of the programmable device; and
- a second I/O bank consisting of a second set of consecutive pins and a third set of pins, the second set of consecutive pins including data and support pins, wherein the first set of consecutive pins of the first I/O bank has a one-to-one correspondence with the second set of consecutive pins of the second I/O bank and the second set of consecutive pins is accessible from a second side of the programmable device; and
- wherein the second set of consecutive pins is arranged as a rotation of the first set of consecutive pins.

2. The programmable device of claim 1, wherein the rotation is a 90 degree rotation.

3. The programmable device of claim 1, wherein the rotation is a 180 degree rotation.

4. The programmable device of claim 1, further comprising:
- a third I/O bank comprising a fourth set of pins, wherein at least the first portion of the pins of the first I/O bank has a one-to-one correspondence with the fourth set of pins of the third I/O bank and wherein the fourth set of pins is accessible from the second side of the programmable device;
- wherein the fourth set of pins is arranged as a symmetrical reflection of the second set of consecutive pins.

5. The programmable device of claim 1, wherein the support pins include power and ground pins, wherein at least a portion of the support pins of each I/O bank are distributed within its respective I/O bank at a regular interval.

6. The programmable device of claim 1 wherein a ratio between the number of support pins and the number of data pins in the first set of pins is the same as a ratio between the number of support pins and the number of data pins in the second set of pins.

7. A programmable device comprising:
- a programmable device core;
- a first I/O bank consisting of a first set of pins including data and support pins arranged in a first consecutive sequence; and
- a second I/O bank consisting of a second set of pins and a third set of pins, the second set of pins including data and support pins, wherein the second set of pins is arranged in a symmetrical reflection of the first sequence.

8. The programmable device of claim 7, wherein the first set of pins and the second set of pins are accessible from a first side of the programmable device.

9. The programmable device of claim 7, wherein the first set of pins is accessible from a first side of the programmable device and the second set of pins is accessible from a second side of the programmable device.

10. The programmable device of claim 9, wherein the first side is perpendicular to the second side.

11. The programmable device of claim 9, wherein the first side is opposite to the second side.

12. The programmable device of claim 7, further comprising:
- a third I/O bank comprising a fourth set of pins, wherein first set of pins is accessible from a first side of the programmable device and the fourth set of pins is accessible from a second side of the programmable device and wherein the fourth set of pins is arranged as a rotation of the first set of pins.

13. The programmable device of claim 7, wherein a first portion of the first set of pins of the first I/O bank has a one-to-one correspondence with the second set of pins of the second I/O bank and a remaining portion of the first set of pins does not have any correspondence with the second set of pins of the second I/O bank.

14. The programmable device of claim 7 wherein the support pins include power and ground pins, the support pins distributed in the first and second I/O banks in regular intervals.

15. The programmable device of claim 7 wherein a ratio between the number of support pins and the number of data pins in the first set of pins is the same as a ratio between the number of support pins and the number of data pins in the second set of pins.

16. A programmable device in a programmable device family comprising a plurality of programmable devices, the programmable device comprising:
- a programmable device core;
- a first I/O bank comprising a first set of pins, wherein the first set of pins includes data pins and support pins, the support pins including power and ground pins; and
- a second I/O bank comprising a second set of pins, wherein a first portion of the pins of the first I/O bank has a one-to-one correspondence with the second set of pins of the second I/O bank, a remaining portion of the first set of pins does not have any correspondence with the second set of pins of the second I/O banks, and a ratio between the number of power and ground pins and the number of data pins is fixed, and
- wherein the power and ground pins are interleaved with the data pins.

17. The programmable device of claim 16, wherein the second set of pins of the second I/O bank includes data pins and support pins, and wherein a ratio between the number of power and ground pins and the number of data pins in the second set of pins is the same as the ratio between the number of power and ground pins and the number of data pins in the first set of pins.

18. The programmable device of claim 16, wherein the support pins include clock pins.

19. The programmable device of claim 16, wherein the second I/O bank is functionally identical to an I/O bank of a second programmable device in the family of programmable devices, wherein the second programmable device has different specifications than the programmable device.

20. The programmable device of claim 16, wherein the first I/O bank and the second I/O bank have similar performance characteristics.

21. The programmable device of claim 20, wherein the performance characteristics include a signal to noise ratio.

22. The programmable device of claim 20, wherein the performance characteristics include a clock skew.

23. The programmable device of claim 16, wherein the first I/O bank has a first fixed number of pins and the second I/O bank has a second fixed number of pins, such that the first and second fixed numbers of pins are adapted to efficiently implement a set of interfaces.

24. The programmable device of claim 23, further comprising a first plurality of I/O banks identical to the first I/O bank, wherein at least a portion of the set of interfaces can be implemented efficiently using at least one of the first plurality of I/O banks and the first I/O bank.

25. The programmable device of claim 23, further comprising a first plurality of I/O banks identical to the second I/O bank, wherein at least a portion of the set of interfaces can be implemented efficiently using at least one of the first plurality of I/O banks and the second I/O bank.

26. The programmable device of claim 23, wherein the set of interfaces includes a memory interface.

27. The programmable device of claim 23, wherein the set of interfaces includes a bus interface.

28. The programmable device of claim 23, wherein the set of interfaces includes a general-purpose digital communications interface.

29. A programmable device comprising:
a programmable device core;
a first plurality of I/O banks of a first type, each I/O bank of the first type comprising data and support pins; and
a second plurality of I/O banks of a second type, each I/O bank of the second type comprising data and support pins; wherein each of the I/O banks of the second type is a compatible superset of an I/O bank of the first type,
wherein a ratio of data pins to at least a portion of the support pins in each of the plurality I/O banks of the first type is the same as a ratio of data pins to at least a portion of the support pins in each of the plurality I/O banks of the second type.

30. The programmable device of claim 29, wherein the portion of the support pins includes ground pins.

31. The programmable device of claim 29, wherein the portion of the support pins includes power pins.

32. The programmable device of claim 29, wherein the portion of the support pins includes clock pins.

33. The programmable device of claim 29, wherein at least a portion of the support pins of each I/O bank of the first plurality are distributed within its respective I/O bank at a regular interval.

34. The programmable device of claim 33, wherein at least a portion of the support pins of each I/O bank of the second plurality are distributed within its respective I/O bank at the regular interval.

35. The programmable device of claim 29, wherein the first and second plurality of I/O banks have similar performance characteristics.

36. The programmable device of claim 35, the performance characteristics include a signal to noise ratio.

37. The programmable device of claim 35, wherein the performance characteristics include a clock skew.

38. The programmable device of claim 29, wherein each I/O bank of the first plurality of I/O banks is functionally identical to an I/O bank of a second programmable device in a family of programmable devices, wherein the second programmable device has different specifications than the programmable device.

39. The programmable device of claim 29, wherein each I/O bank of the second plurality of I/O banks includes a portion functionally identical to an I/O bank of a second programmable device in a family of programmable devices, wherein the second programmable device has different specifications than the programmable device.

40. The programmable device of claim 29, wherein the each of the first plurality of I/O banks has a first fixed number of pins and each of the second plurality of I/O banks has a second fixed number of pins, such that the first and second fixed numbers of pins are adapted to efficiently implement a set of interfaces.

* * * * *